United States Patent
Difazio et al.

(10) Patent No.: US 7,609,736 B2
(45) Date of Patent: Oct. 27, 2009

(54) LASER POWER CONTROL ARRANGEMENTS IN ELECTRO-OPTICAL READERS

(75) Inventors: Costanzo Difazio, East Patchogue, NY (US); Vladimir Gurevich, Stony Brook, NY (US); James Giebel, Centerport, NY (US); Gary G. Schneider, Stony Brook, NY (US); Matthew Blasczak, Coram, NY (US); Mark A. Weitzner, Plainview, NY (US); Edward Barkan, Miller Place, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 113 days.

(21) Appl. No.: 11/239,745

(22) Filed: Sep. 30, 2005

(65) Prior Publication Data

US 2007/0133633 A1    Jun. 14, 2007

(51) Int. Cl.
*H01S 3/00* (2006.01)
(52) U.S. Cl. .............. 372/38.09; 372/38.01; 372/38.02; 372/38.07
(58) Field of Classification Search ................. 372/38.1, 372/38.01–38.09
See application file for complete search history.

(56) References Cited

U.S. PATENT DOCUMENTS

| | | | |
|---|---|---|---|
| 4,713,819 A * | 12/1987 | Yoshikawa | ..................... 372/9 |
| 5,200,597 A | 4/1993 | Eastman et al. | |
| 5,334,826 A * | 8/1994 | Sato et al. | .............. 235/462.06 |
| 5,392,273 A * | 2/1995 | Masaki et al. | ................ 369/106 |
| 5,834,750 A | 11/1998 | Coleman et al. | |
| RE36,491 E * | 1/2000 | Gilliland et al. | .......... 372/38.04 |
| 2003/0035451 A1* | 2/2003 | Ishida et al. | ............. 372/38.02 |
| 2004/0136420 A1* | 7/2004 | Robinson et al. | .............. 372/34 |
| 2005/0092841 A1 | 5/2005 | Barkan | |

OTHER PUBLICATIONS

Preliminary Report on Patentability dated Mar. 19, 2009 in related application PCT/US2006/034015.

* cited by examiner

*Primary Examiner*—Minsun Harvey
*Assistant Examiner*—Xnning Niu

(57) ABSTRACT

Laser power control arrangements interrupt power to a laser used in electro-optical readers upon detection of an over-power condition not conforming to preestablished regulatory standards. In one embodiment, during an operational mode, a difference between laser drive currents at two operating points is compared to a difference between laser drive currents at the same two operating points during a calibration mode. The over-power condition is recognized when the difference during the operational mode exceeds the difference during the calibration mode by a predetermined amount. In another embodiment, the laser is only energized to emit the beam at a reduced power level well below regulatory standards for staring at even if a motor drive failed.

10 Claims, 3 Drawing Sheets

LASER POWER CONTROL ARRANGEMENTS IN ELECTRO-OPTICAL READERS

BACKGROUND OF THE INVENTION

1. Field of the Invention

The present invention generally relates to electro-optical readers, such as laser scanners for reading indicia, such as bar code symbols and, more particularly, to laser power control arrangements for meeting governmental regulatory standards.

2. Description of the Related Art

Various electro-optical systems or readers have been developed for reading indicia such as bar code symbols appearing on a label or on a surface of an article. The bar code symbol itself is a coded pattern of graphic indicia comprised of a series of bars of various widths spaced apart from one another to bound spaces of various widths, the bars and spaces having different light reflecting characteristics. The readers function by electro-optically transforming the pattern of the graphic indicia into a time-varying electrical signal, which is digitized and decoded into data relating to the symbol being read.

Typically, a laser beam from a laser is directed along a light path toward a target that includes the bar code symbol on a target surface. A moving-beam scanner operates by repetitively sweeping the laser beam in a scan line or a series of scan lines across the symbol by means of motion of a scanning component, such as the laser itself or a scan mirror disposed in the path of the laser beam. Optics focus the laser beam into a beam spot on the target surface, and the motion of the scanning component sweeps the beam spot across the symbol to trace a scan line across the symbol. Motion of the scanning component is typically effected by an electrical drive motor.

The readers also include a sensor or photodetector which detects light along the scan line that is reflected or scattered from the symbol. The photodetector or sensor is positioned such that it has a field of view which ensures the capture of the reflected or scattered light, and converts the latter into an electrical analog signal.

In retroreflective light collection, a single optical component, e.g., a reciprocally oscillatory mirror, such as described in U.S. Pat. No. 4,816,661 or U.S. Pat. No. 4,409,470, both herein incorporated by reference, sweeps the beam across the target surface and directs the collected light to the sensor. In non-retroreflective light collection, the reflected laser light is not collected by the same optical component used for scanning. Instead, the sensor is independent of the scanning beam and has a large field of view. The reflected laser light may trace across the sensor.

Electronic control circuitry and software decode the electrical analog signal from the sensor into a digital representation of the data represented by the symbol that has been scanned. For example, the analog electrical signal generated by the photodetector may be converted by a digitizer into a pulse width modulated digitized signal, with the widths corresponding to the physical widths of the bars and spaces. Alternatively, the analog electrical signal may be processed directly by a software decoder. See, for example, U.S. Pat. No. 5,504,318.

The decoding process usually works by applying the digitized signal to a microprocessor running a software algorithm, which attempts to decode the signal. If a symbol is decoded successfully and completely, the decoding terminates, and an indicator of a successful read (such as a green light and/or audible beep) is provided to a user. Otherwise, the microprocessor receives the next scan, and performs another decoding into a binary representation of the data encoded in the symbol, and to the alphanumeric characters so represented. Once a successful read is obtained, the binary data is communicated to a host computer for further processing, for example, information retrieval from a look-up table.

Although reading performance is enhanced when the output power of the laser is increased, government regulatory safety standards dictate the maximum power output of the laser for human safety. Some of these standards require that the output power of the laser does not exceed regulatory limits even when control circuitry that normally regulates the laser output power fails.

For example, a monitor photodiode inside the laser housing is normally operative for monitoring the raw laser output power. The monitor photodiode is part of a feedback circuit for maintaining the laser output power constant during operation. If the monitor photodiode were to lose sensitivity, fail, or to become electrically disconnected from the feedback circuit, then the feedback signal would increase or be lost, and the feedback circuit would increase the laser output power, possibly to a level exceeding regulatory limits.

Another example involves a drive transistor electrically connected in series with the laser and normally operative to generate a drive current to energize the laser. If the drive transistor were to fail, then the laser output power might increase to levels exceeding regulatory limits.

Laser readers typically sweep the laser beam with a motor drive, and a motor fail circuit is provided to deenergize the laser if the motor drive is not operational. After the motor fail circuit deenergizes the laser, an operator wondering what is wrong with the reader might stare inside a window of the reader while pulling the trigger despite printed caution labels stating "Do not stare into laser beam" If the motor drive restarts, there is no problem with staring at the moving beam. However, if the motor drive does not restart, then the output power for the stationary laser beam now being emitted from the reader will not meet regulatory standards.

SUMMARY OF THE INVENTION

Objects of the Invention

Accordingly, it is a general object of this invention to control the power output of the laser to meet regulatory standards.

It is an additional object of the present invention to deenergize the laser upon detection that the laser output power exceeded a preestablished regulatory standard.

It is another object of the present invention to meet regulatory standards while maximizing reader performance.

Still another object of this invention is to energize the laser to emit a laser beam with a reduced output power level even if the motor drive failed.

FEATURES OF THE INVENTION

In keeping with the above objects and others which will become apparent hereinafter, one feature of the present invention resides, briefly stated, in a laser power control arrangement in an electro-optical reader for reading indicia, such as bar code symbols, by regulating output power of a laser beam emitted by a laser to indicia to be read.

The arrangement includes a laser drive circuit for energizing the laser in a calibration mode, and subsequently in an operating mode. During the calibration mode, the output power of the emitted laser beam is measured, for example, with a power meter, and a microcontroller is operative to adjust a digital potentiometer to a first setting such that the measured output power is a first output power that is known to be within regulatory limits. The microcontroller is next operative to adjust the potentiometer again to a second setting such that the measured output power is a different second output power that is also known to be within regulatory limits. The drive currents flowing through the laser at the first and second output powers, and referred to herein as the first and second, calibration drive currents, are recorded and their difference is stored, typically in a memory associated with the microcontroller. The first and second settings of the potentiometer are also stored. As described so far, the calibration difference between the calibration drive currents that correspond to the first and second output powers of the laser beam, as well as the potentiometer settings, are stored for subsequent use.

During the operating mode, for example, at start-up of the laser, the microcontroller is operative to adjust the potentiometer to the first setting, and to record in the memory a first operating drive current that corresponds to the first output power. The microcontroller is next operative to adjust the potentiometer to the second setting, and record in the memory a second operating drive current that corresponds to the second output power. The difference between the drive currents flowing through the laser at the same first and second output powers, and referred to herein as the first and second, operating drive currents, is recorded and stored in the memory as the operating difference.

During the operating mode, the microcontroller compares the operating difference with the calibration difference. If the operating difference exceeds the calibration difference by a predetermined amount, then the microcontroller is further operative for deenergizing the laser since the excess indicates that the output power of the laser beam is beyond regulatory standards.

The raw output power of the laser beam is directly proportional to the drive current flowing through the laser in an operating region of the laser. Indeed, the laser beam output power is a nearly linear function of the laser drive current in the operating region of the laser. The slope of this linear transfer function is nearly constant but varies slightly over temperature variations and aging of the laser. The slope of the transfer function may be assumed to be substantially the same during the calibration mode and the operating mode, but it is preferred, if a temperature sensor is employed to measure the temperature, and if the microcontroller takes the temperature variations into account.

The measurement of two drive currents in both the calibration and operating modes is employed to resist the effects of temperature and other variables. For example, however the temperature affects the first operating drive current, the second operating drive current is similarly affected. By employing the difference between the drive currents, the effects of temperature and other variables are eliminated.

Still another feature regulates the output power of the laser beam swept by a motor drive. A motor failure circuit is operative for detecting failure of the motor drive, and a controller is operative for energizing the laser to emit the laser beam with a reduced level of output power even if the motor failure circuit detects motor drive failure, and the emitted beam is stationary. Thus, even if an operator stares, despite caution labels, into the stationary laser beam being emitted by the reader, the output power of the stationary laser beam has been set to the reduced level that meets regulatory standards. As soon as the controller confirms that the motor drive is operating normally, and the emitted beam is being swept, the controller energizes the laser to emit the laser beam with a higher level of output power to enhance reader performance. If the confirmation that the motor drive is operating normally is not received within a given period of time, then the motor failure circuit is further operative for deenergizing the laser.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE PREFERRED EMBODIMENTS

Figure 1:
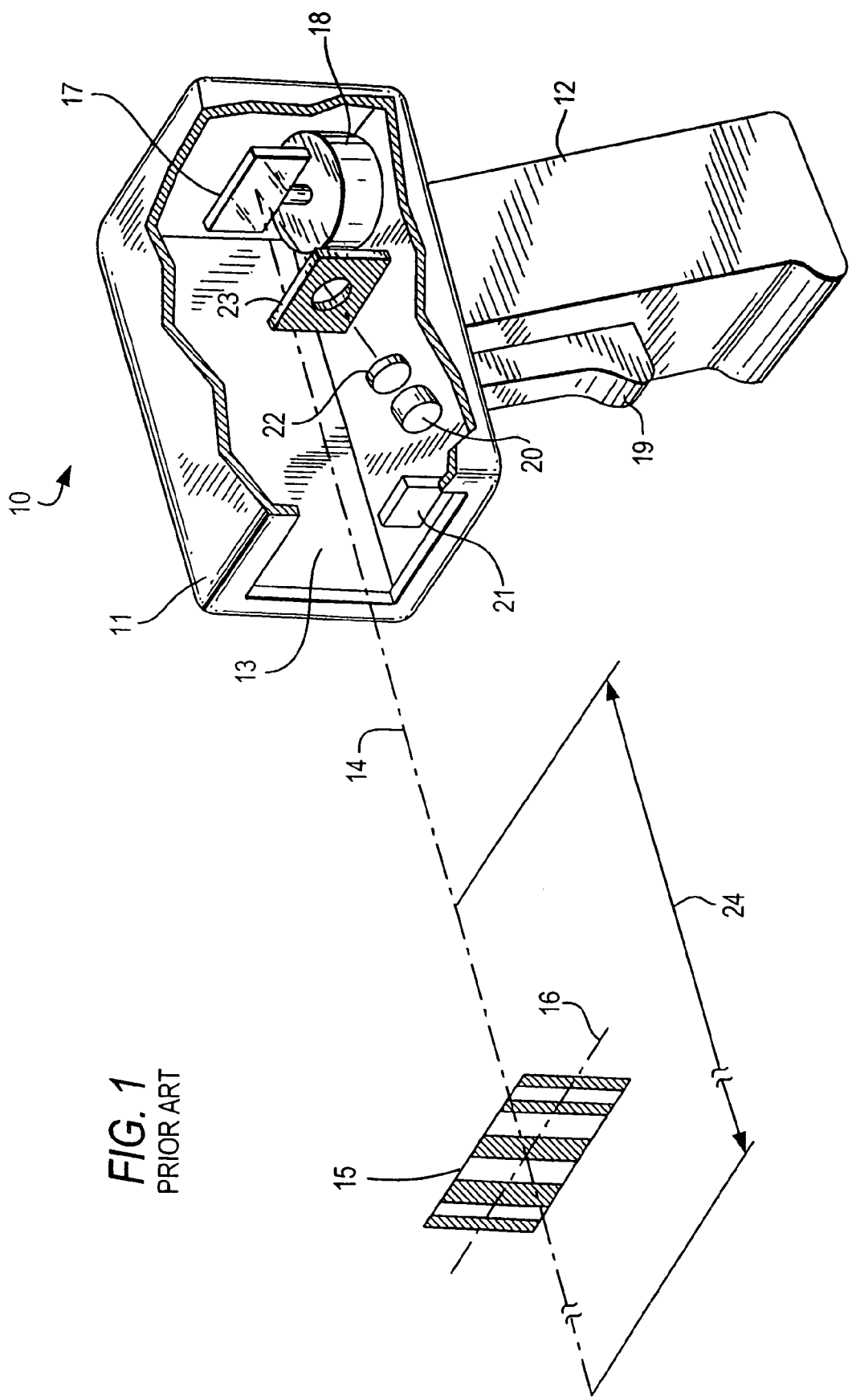
FIG. 1 is a perspective view of an electro-optical reader in accordance with the prior art.

As used herein, the term "symbol" broadly encompasses not only symbol patterns composed of alternating bars and spaces of various widths as commonly referred to as bar code symbols, but also other one- or two-dimensional graphic patterns, as well as alphanumeric characters. In general, the term "symbol" may apply to any type of pattern or indicia which may be recognized or identified either by scanning a light beam and detecting reflected or scattered light as a representation of variations in light reflectivity at various points of the pattern or indicia. FIG. 1 shows an indicium 15 as one example of a "symbol" to be read.

FIG. 1 depicts a handheld laser scanner device 10 for reading symbols. The laser scanner device 10 includes a housing having a barrel portion 11 and a handle 12. Although the drawing depicts a handheld pistol-shaped housing, the invention may also be implemented in other types of housings such as a desk-top workstation or a stationary scanner. In the illustrated embodiment, the barrel portion 11 of the housing includes an exit port or window 13 through which an outgoing laser light beam 14 passes to impinge on, and scan across, the bar code symbol 15 located at some distance from the housing.

The laser beam 14 moves across the symbol 15 to create a scan pattern. Typically, the scanning pattern is one-dimensional or linear, as shown by line 16. This linear scanning movement of the laser beam 14 is generated by an oscillating scan mirror 17 driven by an oscillating motor drive 18. If desired, means may be provided to scan the beam 14 through a two-dimensional scanning pattern, to permit reading of two-dimensional optically encoded symbols. A manually-actuated trigger 19 or similar means permit an operator to initiate the scanning operation when the operator holds and aims the device 10 at the symbol 15.

The scanner device 10 includes an energizable laser source 20 mounted within the housing. The laser source 20 generates the laser beam 14. A photodetector 21 is positioned within the housing to collect at least a portion of the light reflected and scattered from the bar code symbol 15. The photodetector 21, as shown, faces toward the window 13 and has a static, wide field of view characteristic of the non-retro-reflective readers described above. Alternatively, in a retro-reflective reader, a convex portion of the scan mirror 17 may focus collected light on the photodetector 21, in which case the photodetector faces toward the scan mirror. As the beam 14 sweeps the symbol 15, the photodetector 21 detects the light reflected and scattered from the symbol 15 and creates an analog electrical signal proportional to the intensity of the collected light.

A digitizer (not shown) typically converts the analog signal into a pulse width modulated digital signal, with the pulse widths and/or spacings corresponding to the physical widths of the bars and spaces of the scanned symbol 15. A decoder (not shown), typically comprising a programmed microprocessor with associated RAM and ROM, decodes the pulse width modulated digital signal according to the specific symbology to derive a binary representation of the data encoded in the symbol, and the alphanumeric characters represented by the symbol.

The laser source 20 directs the laser beam through an optical assembly comprising a focusing lens 22 and an aperture stop 23, to modify and direct the laser beam onto the scan mirror 17. The mirror 17, mounted on a vertical shaft and oscillated by the motor drive 18 about a vertical axis, reflects the beam and directs it through the exit port 13 to the symbol 15.

To operate the scanner device 10, the operator depresses trigger 19 which activates the laser source 20 and the motor drive 18. The laser source 20 generates the laser beam which passes through the element 22 and aperture 23 combination. The element 22 and aperture 23 modify the beam to create an intense beam spot of a given size which extends continuously and does not vary substantially over a range 24 of working distances. The element and aperture combination directs the beam onto the rotary mirror 17, which directs the modified laser beam outwardly from the scanner housing 11 and toward the bar code symbol 15 in a sweeping pattern, i.e., along scan line 16. The bar code symbol 15, placed at any point within the working distance 24 and substantially normal to the laser beam 14, reflects and scatters a portion of the laser light. The photodetector 21, shown mounted in the scanner housing 11 in a non-retro-reflective position, detects the reflected and scattered light and converts the received light into an analog electrical signal. The photodetector could also be mounted in a retro-reflective position facing the scan mirror 17. The system circuitry then converts the analog signal to a pulse width modulated digital signal which a microprocessor-based decoder decodes according to the characteristics of the bar code symbology rules.

Figure 2:
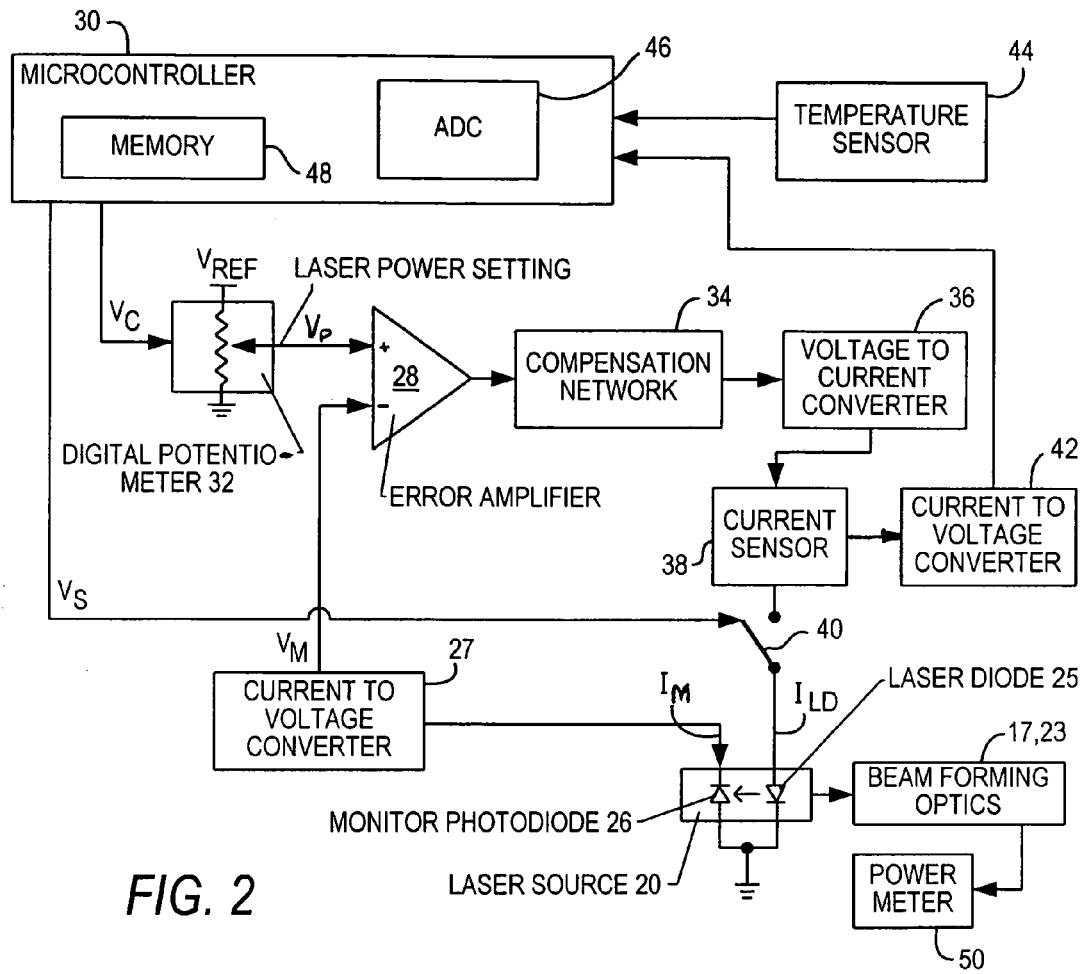
FIG. 2 is a part-diagrammatic, circuit schematic depicting one embodiment of a laser power control arrangement in accordance with the present invention especially useful in the reader of FIG. 1.

As shown in FIG. 2, the laser source 20 includes a laser diode 25 and a monitor photodiode 26 within the laser source. The monitor photodiode 26 is operative for monitoring the raw output power of the diode 25. The photodiode 26 is part of a feedback circuit operative for maintaining the laser output power constant. The feedback circuit includes a current to voltage converter 27 for converting the monitor drive current $I_M$ flowing through the monitor photodiode 26 to a monitor drive voltage $V_M$ which, in turn, is connected to a negative terminal of an error amplifier 28. A microcontroller 30, preferably the same one used to decode the symbol, generates, as described below, respective digital control signals $V_c$ to set a digital potentiometer 32 to respective potentiometer settings. An output signal $V_p$ from the potentiometer is conducted to a positive terminal of the error amplifier 28, and an output of the error amplifier is conducted to a compensation network 34 whose output voltage is converted to a current by a voltage to current converter 36 which, in turn, is connected to a current sensor 38.

The current flowing through the current sensor 38 is conducted through a normally closed power switch 40 to the laser diode 25 to energize the same with a drive current $I_{LD}$ to emit the laser beam 14 with an output power. The current flowing through the current sensor 38 is also preferably reduced in amplitude by flowing through a divider and is converted by a current to voltage converter 42 to a voltage which is fed back to the microprocessor 30 via an analog to digital converter (ADC) 46.

A temperature sensor 44 is also connected to the ADC 46 to apprise the microcontroller of the temperature. Also, the microprocessor is associated with a memory 48 in which data is stored.

As described so far, the interior monitor photodiode 26 detects changes in raw output power of the laser beam emitted by laser diode 25 and sends a feedback signal to the error amplifier 28 to allow more or less drive current to pass through the laser diode 25. The greater this drive current, the greater the laser output power, and vice versa, as explained below in connection with FIGS. 3-4.

If the monitor photodiode 26 loses its sensitivity, or fails, or becomes electrically disconnected, or for any change in the feedback circuit, then the laser output power will increase. Regulatory safety limits can still be obtained by a laser power control arrangement which, in accordance with this invention, monitors the output power of the laser diode 25 and deenergizes the latter when an over-power condition is detected.

Figure 4:
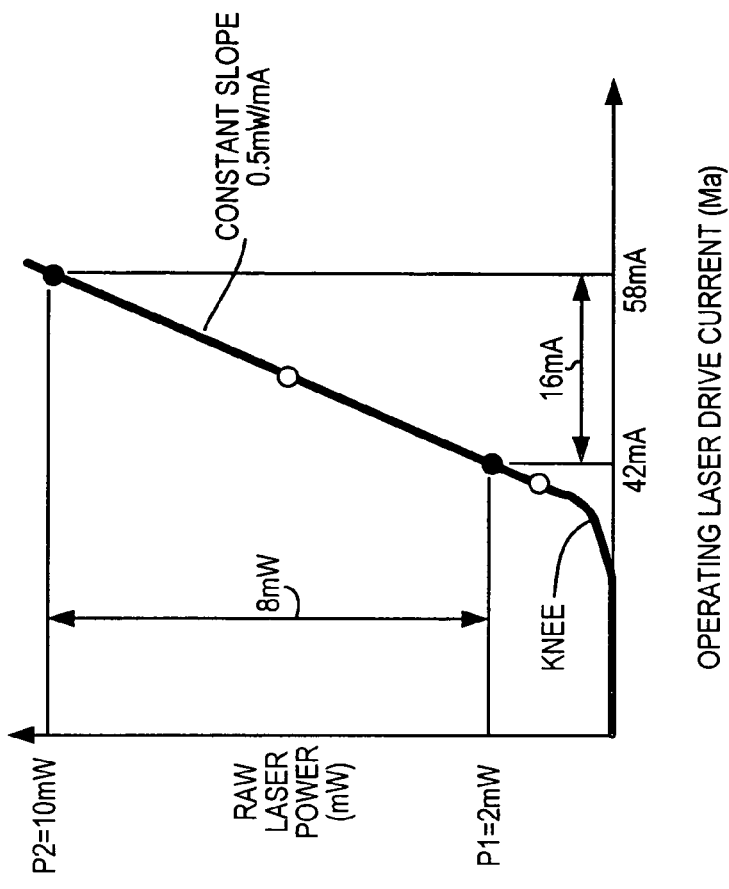
FIG. 4 is a graph analogous to FIG. 3, but during an operating mode.
Figure 3:
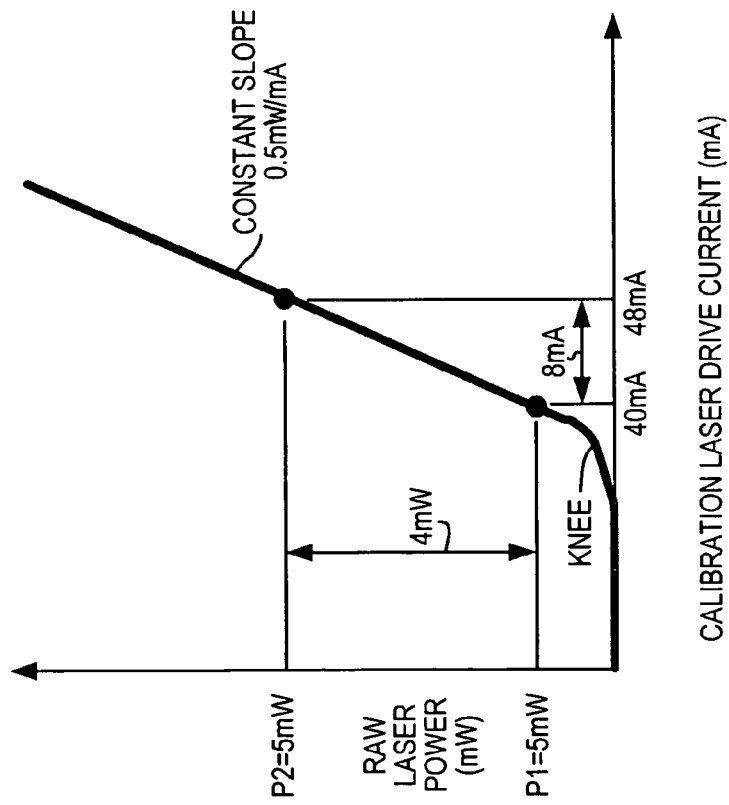
FIG. 3 is a graph depicting raw laser power operation of the circuit of FIG. 2 during a calibration mode.

The transfer function of a laser in which the raw output power of the emitted laser beam is plotted against the drive current flowing through the laser is depicted in FIGS. 3-4. FIG. 3 depicts a numerical example of powers and currents that can be encountered during a calibration mode, whereas FIG. 4 depicts a numerical example of powers and currents that can be encountered during an operating mode. In order for a laser to emit light, a drive current must be pumped through the laser at the threshold of operation, commonly referred to as the "knee" of the transfer function. Once this threshold is exceeded, additional drive current produces output powers that are directly, or nearly linearly proportional, to the drive current. The laser of the instant invention is operated in this linear region of the transfer function. The slope of this linear region, also called the "slope efficiency", is assumed to be substantially constant but does slightly vary with variations in temperature or with aging. For example, this linear region may change by about 20% as the temperature varies over extremes, e.g., from −30° C. to +65° C.

The change in slope as a function of temperature can be stored in the memory of the microcontroller. Thus, during the operating mode, the temperature sensor 44 apprises the microcontroller of the current temperature and, in turn, the microcontroller corrects the transfer function as a function of the detected temperature.

During the calibration mode, that is after manufacture of the reader and during an initial powering up of the reader, the output power of the emitted laser beam is measured and monitored, preferably by a power meter 50 downstream of beam forming optics 17, 23, and the microcontroller 40 adjusts the potentiometer 32 so that the output power of the laser beam measures a first output power, which is known to be within regulatory limits, for example, 1 milliwatt. The current sensor 38 measures the corresponding drive current, for example, 40 milliamps, to produce the output power of 1 milliwatt. This measured drive current is stored in the memory 48, as is the potentiometer setting P1 needed to produce the output power of 1 milliwatt.

During the same calibration mode, the microcontroller 40 again adjusts the potentiometer so that the laser beam output power measures a second output power, also known to be within regulatory limits, for example, 5 milliwatts. As before, the current sensor 38 measures the corresponding drive current, for example, 48 mA, and this measured drive current, together with the new potentiometer setting P2, are stored in the memory 48.

The microcontroller 30 then calculates the difference between the calibration drive currents (48–40 mA=8 mA), and stores this calibration difference in the memory. The microcontroller now knows that it takes 8 mA to change the output power by 4 mW (5 mW-1 mW). The slope of this linear region is 0.5 mW/mA.

During a subsequent operating mode, for example, during reading of the indicia, the microcontroller 30 executes a similar routine. The microcontroller sets the potentiometer 32 at the first potentiometer setting P1, and the current sensor measures the corresponding drive current. Then, the microcontroller sets the potentiometer 32 at the second potentiometer setting P2, and the current sensor measures the corresponding drive current.

Assuming, for the sake of explanation, that the monitor photodiode 26 sensitivity is cut in half, then the corresponding output powers for the laser beam are doubled. Thus, the output power at the first potentiometer setting P1 will be 2 mW, and the output power at the second potentiometer setting P2 will be 10 mW. In order for the slope of the linear region of the transfer function to be constant, then the corresponding operating drive currents are 42 mA and 58 mA for the first and second potentiometer settings, respectively.

The microcontroller then calculates the difference between the operating drive currents (58 mA–42 mA=16 mA), and stores this operating difference in the memory. The microcontroller then compares the operating difference (16 mA) with the calibration difference (8 mA). Since the operating difference is two times greater than the calibration difference, the microcontroller now knows that the output power has doubled. The microcontroller generates a switch signal $V_s$ operative to open the normally closed power switch 40, thereby deenergizing the laser and preferably notifying a remote host that the laser is failing or has failed.

By comparing drive current differences, any effects caused by temperature variations or other variables are substantially reduced, if not eliminated. Thus, if a certain temperature affects the power and the drive current at one potentiometer setting, then it will correspondingly affect the power and the drive current at the other potentiometer setting. By subtracting the drive current differences, such variations are removed.

Figure 5:
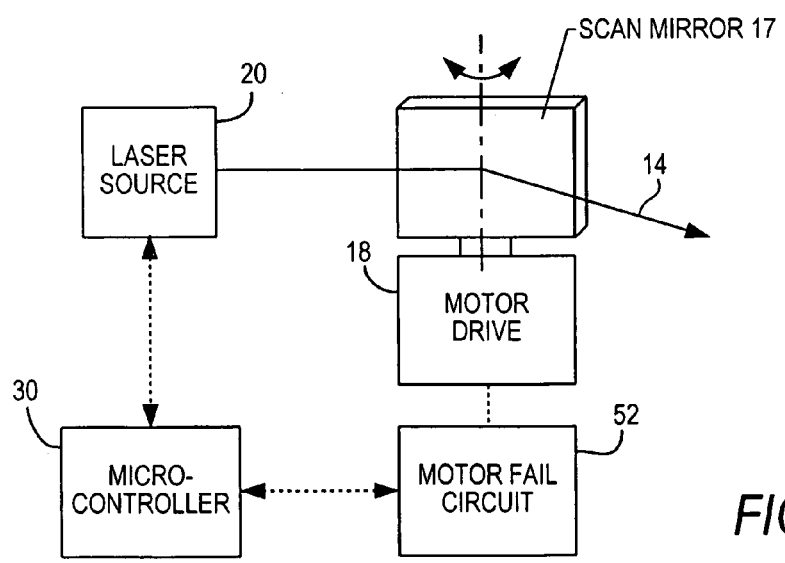
FIG. 5 is a part-diagrammatic, circuit schematic depicting another embodiment of a laser power control arrangement in accordance with the present invention also useful in the reader of FIG. 1.

Turning now to FIG. 5, another embodiment of a laser power control arrangement is disclosed for regulating the output power of the laser beam 14 that is emitted by the laser source 20 and that is swept by the scan mirror 17 by the motor drive 18. A motor fail circuit 52 detects failure of the motor drive 18 and, according to the prior art, deenergizes the laser source 20 if the motor drive 18 is not running. However, some operators, wondering why the laser source 20 is not emitting the laser beam, may look inside a window of the reader to see what is wrong. During this time, the operator may depress the trigger 19 one or more times. If the motor drive 18 restarts, there is no problem with staring at the moving laser beam. However, if the motor drive 18 does not restart, then the laser will emit a stationary laser beam whose output power level exceeds regulatory limits. This scenario, of course, assumes that the operator ignores the warning labels on the reader advising the operator not to directly stare at the laser beam.

In accordance with this invention, it is proposed, upon depression of the trigger 19, to energize the laser source 20 to emit the laser beam with a reduced level of output power well below regulatory limits for staring at even if the scan mirror 17 is not being oscillated. As soon as a confirmation that the scan mirror 17 is being oscillated is received by the microcontroller 30, then the laser source 20 is energized to emit the laser beam with a higher level of output power to maximize reading performance. If the confirmation that the scan mirror is being oscillated is not received within some predetermined time period, then the motor fail circuit 52 is operative for completely deenergizing the laser source.

Confirmation that the scan mirror 17 is being oscillated may be determined by various optical or electrical techniques. Typically, a permanent magnet is jointly mounted on the scan mirror 17, and a feedback coil is positioned in proximity to the permanent magnet and is operative to generate a periodic signal during oscillation of the permanent magnet. A zero crossing detector is employed to detect each time the periodic signal passes through zero, and the resulting signal is employed by the microcontroller for many purposes, one of which is to confirm that the scan mirror 17 is truly being oscillated.

It will be understood that each of the elements described above, or two or more together, also may find a useful application in other types of constructions differing from the types described above.

While the invention has been illustrated and described as embodied in laser power control arrangements in electro-optical readers, it is not intended to be limited to the details shown, since various modifications and structural changes may be made without departing in any way from the spirit of the present invention.

In a variation, the laser power control arrangement need not operate by comparing the differences between two drive currents in each of the calibration and operation modes. Especially if the temperature sensor is employed, the invention can also include comparing a single operating drive current in the operation mode with a single calibration drive current in the calibration mode.

Although described in connection with moving-beam readers, the laser control arrangements of this invention can equally well be applied to any system in which a light source is used for illumination of, and for aiming at, a target.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

We claim:

1. A laser power control arrangement for regulating output power of a laser beam emitted by a laser in an electro-optical reader for reading indicia, comprising:

a laser drive circuit for energizing the laser a plurality of times at substantially the same first temperature in a calibration mode to emit the laser beam with different, first and second output powers that respectively correspond to different, first and second, calibration drive currents, and for energizing the laser a plurality of times at substantially the same second temperature in an operating mode to emit the laser beam with the same first and second output powers that respectively correspond to different, first and second, operating drive currents;

a memory for storing a calibration difference between the first and second, calibration drive currents, the calibration difference being resistant to variations in the first temperature in the calibration mode, and the memory being further operative for storing an operating difference between the first and second, operating drive currents, the operating difference being resistant to variations in the second temperature in the operating mode; and a controller operative in the operating mode for comparing the operating difference between the first and second, operating drive currents with the calibration difference between the first and second, calibration drive currents to resist variations between the first temperature and the second temperature, and for deenergizing the laser when the operating difference exceeds the calibration difference by a predetermined amount.

2. The arrangement of claim 1, wherein the laser drive circuit includes a digital potentiometer controlled by the controller to set potentiometer settings that correspond to the first and second output powers.

3. The arrangement of claim 2, wherein the memory is operative for storing the potentiometer settings.

4. The arrangement of claim 1, wherein the controller includes a control switch connected to the laser, the control switch being opened by the controller to interrupt the operating drive currents from reaching the laser.

5. The arrangement of claim 1, wherein the laser drive circuit includes a monitor photodiode for detecting the laser beam emitted by the laser, and a redundant feedback circuit for generating a feedback signal that redundantly deenergizes the laser based on detection by the monitor photodiode.

6. A laser power control method of regulating output power of a laser beam emitted by a laser in an electro-optical reader for reading indicia, comprising the steps of:

energizing the laser a plurality of times at substantially the same first temperature in a calibration mode to emit the laser beam with different, first and second output powers that respectively correspond to different, first and second, calibration drive currents, and energizing the laser a plurality of times at substantially the same second temperature in an operating mode to emit the laser beam with the same first and second output powers that respectively correspond to different, first and second, operating drive currents;

storing a calibration difference between the first and second, calibration drive currents, the calibration difference being resistant to variations in the first temperature in the calibration mode, and storing an operating difference between the first and second, operating drive currents, the operating difference being resistant to variations in the second temperature in the operating mode; and comparing during the operating mode the operating difference between the first and second, operating drive currents with the calibration difference between the first and second, calibration drive currents to resist variations between the first temperature and the second temperature, and deenergizing the laser when the operating difference exceeds the calibration difference by a predetermined amount.

7. The method of claim 6, and the step of establishing digital potentiometer settings that correspond to the first and second output powers.

8. The method of claim 7, and the step of storing the potentiometer settings.

9. The method of claim 6, and the step of opening a control switch connected to the laser, to interrupt the operating drive currents from reaching the laser.

10. The method of claim 6, and the step of detecting the laser beam emitted by the laser, and generating a feedback signal that redundantly deenergizes the laser based on the detecting step.

* * * * *

UNITED STATES PATENT AND TRADEMARK OFFICE
CERTIFICATE OF CORRECTION

| | | |
|---|---|---|
| PATENT NO. | : 7,609,736 B2 | Page 1 of 1 |
| APPLICATION NO. | : 11/239745 | |
| DATED | : October 27, 2009 | |
| INVENTOR(S) | : Difazio et al. | |

It is certified that error appears in the above-identified patent and that said Letters Patent is hereby corrected as shown below:

ON THE FACE PAGE

1. On the Title Page, in Item (56), under "assistant Examiner", in Column 2, Line 1, delete "Xnning Niu" and insert -- Xinning Niu --, therefor.

Signed and Sealed this

Eighth Day of June, 2010

David J. Kappos
*Director of the United States Patent and Trademark Office*